United States Patent
Hsieh

(10) Patent No.: US 7,002,200 B2
(45) Date of Patent: Feb. 21, 2006

(54) SELF-ALIGNED STRUCTURE WITH UNIQUE ERASING GATE IN SPLIT GATE FLASH

(75) Inventor: Chia-Ta Hsieh, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 10/877,677

(22) Filed: Jun. 25, 2004

(65) Prior Publication Data

US 2004/0241942 A1 Dec. 2, 2004

Related U.S. Application Data

(62) Division of application No. 10/288,194, filed on Nov. 5, 2002, now Pat. No. 6,780,785.

(51) Int. Cl.
 *H01L 27/108* (2006.01)
 *H01L 29/76* (2006.01)
 *H01L 29/94* (2006.01)
 *H01L 31/119* (2006.01)

(52) U.S. Cl. ..................................... 257/296; 257/320
(58) Field of Classification Search ................ 257/296, 257/68, 314, 315, 316, 318, 319, 320
See application file for complete search history.

(56) References Cited

U.S. PATENT DOCUMENTS

| | | | | |
|---|---|---|---|---|
| 6,043,530 A | | 3/2000 | Chang | 257/320 |
| 6,096,603 A | * | 8/2000 | Chang et al. | 438/258 |
| 6,101,131 A | | 8/2000 | Chang | 365/185.33 |
| 6,125,060 A | | 9/2000 | Chang | 365/185.29 |
| 6,261,907 B1 | | 7/2001 | Chang | 438/266 |
| 6,274,436 B1 | | 8/2001 | Kao et al. | 438/267 |
| 6,281,545 B1 | * | 8/2001 | Liang et al. | 257/315 |
| 6,476,440 B1 | * | 11/2002 | Shin | 257/320 |
| 6,638,821 B1 | * | 10/2003 | Hsieh | 438/257 |
| 6,747,310 B1 | * | 6/2004 | Fan et al. | 257/320 |
| 6,818,512 B1 | * | 11/2004 | Hsieh | 438/267 |

* cited by examiner

*Primary Examiner*—David Nhu
(74) *Attorney, Agent, or Firm*—Thomas, Kayden, Horstemeyer & Risley

(57) ABSTRACT

A split-gate flash memory device. The device includes a floating gate, a control gate, and an erase gate. The floating gate is overlying a substrate. The control gate is laterally adjacent to the floating gate and overlying the substrate. The erase gate is laterally adjacent to the floating gate and overlying the control gate, in which the erase gate is between a sidewall spacer and the floating gate.

21 Claims, 9 Drawing Sheets

SELF-ALIGNED STRUCTURE WITH UNIQUE ERASING GATE IN SPLIT GATE FLASH

CROSS-REFERENCE TO RELATED APPLICATIONS

This application is a division of U.S. patent application Ser. No. 10/288,194, filed on Nov. 5, 2002, now U.S. Pat. No. 6,780,785.

BACKGROUND OF THE INVENTION (1) Field of the Invention

The invention relates to flash memory cells, and, more particularly, to a method to form flash memory cells with a unique erasing gate structure.

(2) Description of the Prior Art

EEPROM or flash EEPROM memory is frequently used in electronic systems. EEPROM provides a medium for data storage that can withstand power interruption without losing data. Typical EEPROM cells comprise a form of a MOS transistor having a floating gate and a control gate. The floating gate is constructed so that it can be charged or discharged. The charge state can be maintained over an indefinite period. The control gate is used both in the program/erase operation and in the reading operation. The charge state of the floating gate determines the relative threshold voltage of the flash transistor and this, in turn, determines if a "0" or a "1" value has been stored.

Referring now to FIG. 1, a typical flash cell is shown. This flash cell comprises two transistors, each further comprising a floating gate 14, a control gate 18, a drain region 42, and a common source region 38. This shared source arrangement is found to be an efficient way to layout flash cells in a large array. The flash cell is constructed on a substrate 10. The drains 42 and sources 38 are formed in the substrate 10. The floating gates 14 typically comprise a polysilicon layer 26 overlying the substrate 10 with a gate oxide layer 22 therebetween. In this flash cell example, the control gates 18 are adjacent to the floating gates 14 in what is called a split gate arrangement. The control gates 18 comprise another polysilicon layer 28 adjacent to the floating gate polysilicon 26 with a second gate oxide layer 34 therebetween. In addition, the control gates 18 overlie the substrate 10 with the second gate oxide 34 therebetween.

In this configuration, the channel region between the drain 42 and source 38 of either flash transistor is controlled by two gates. First, the floating gate 14 couples stored charge and capacitively coupled charge from the control gate 18 onto a first part of the channel. Second, the control gate 18 couples charge onto the channel. This split gate arrangement has a particular advantage over flash transistors where the control gate is stacked over the floating gate. Namely, the control gate 18 can completely shut off the channel when the cell is not selected. This insures that no leakage current is generated by an unselected cell regardless of the charge state of the floating gate 14. This is a particularly useful feature for cases where the floating gate 14 has been over-erased such that the threshold voltage is reduced to below zero volts.

It should be noted the control gate 18 is used for several functions in the flash cell. In particular, the control gate 18 is used for erasing the cell. In the erasing operation, a high voltage is forced onto control gate 18, also called the word line, of the cell. For example, the word line 18 is forced to about 12 Volts while the common source 38 and drain 42, also called the bit line drain, are forced to 0 Volts. In this operation, electrons are injected from the floating gate 14 into the control gate 18 to cause the floating gate 14 to be erased. In the programming operation, the word line 18 is forced to about 2.5 Volts while the common source 38 is forced to a high voltage of about 10 Volts and the bit line drain 42 is forced to about 0.5 Volts. This condition causes source side 38 injection of electrons from the substrate 10 to the floating gate 14 and results in programming. Finally, during a reading operation, the word line gate is forced to about 2.5 Volts while the common source 38 is forced to about 0 Volts and the bit line drain 42 is forced to about 1.5 Volts. This condition will detect the presence of channel current to verify the state of the cell ("0" or "1").

The above-described operating conditions imply that the thickness Y of the dielectric between the control gate 18 and the substrate 10 should be large to withstand a large gate-to-substrate voltage during erasing without gate oxide breakdown. Further, the distance X between the control gate 18 and the floating gate channel should be small to increase the lateral electric field and to aid in generating hot electron injection. Finally, the thickness Z of the dielectric between the control gate 18 and the floating gate 14 should be small to provide high current gain for the flash device during reading. However, in this prior art device, a single dielectric layer 34 must meet all of these requirements. In particular, the second gate oxide layer 34 must meet be both thick enough to withstand the erasing mode and thin enough to provide efficient programming and reading. It is found that the multiple use, control gate 18 and single thickness dielectric layer 34 are not capable of meeting the performance requirements for future flash systems.

Several prior art inventions relate flash memory cells having control gates and erase gates. U.S. Pat. Nos. 6,101, 131, 6,125,060, and 6,261,907 B1 to Chang disclose a flash EEPROM device having an erasing gate terminal. The erasing gate is formed beside a control gate/flash gate stack. The erasing gate overlies and controls a part of the active channel. U.S. Pat. No. 6,274,436 B1 to Kao et al describes a flash EEPROM cell having an erase gate. The floating gate is formed. A control gate is formed overlying part of the floating gate and a part of the channel in split-gate form. An erase gate is formed overlying another part of the floating gate and the channel.

SUMMARY OF THE INVENTION

A principal object of the present invention is to provide an effective and very manufacturable flash memory device.

A further object of the present invention is to provide a method to form a flash memory device with improved programming and erasing efficiency.

A yet further object of the present invention is to provide a method to form a flash memory device with optimized efficiency and high reliability.

A yet further object of the present invention is to provide a method to form a flash memory device where the key elements of the structure are self-aligned.

A yet further object of the present invention is to provide a flash memory cell with a dedicated erase gate.

A yet further object of the present invention is to provide an improved flash memory cell with an erase gate without increasing the cell size.

In accordance with the objects of this invention, a method to form control gates and erase gates for split-gate flash memory cells is achieved. The method comprises providing floating gates overlying a substrate. A control dielectric layer is formed overlying the floating gates and the substrate. A control conductor layer is formed overlying the control dielectric layer. Sidewall spacers are formed on the control conductor layer. The control conductor layer is partially etched down to create gaps between the sidewall spacers and the floating gates. The remaining control conductor layer forms control gates laterally adjacent to the floating gates. An isolating dielectric layer is formed overlying the control gates. An erase dielectric layer is formed lining the gaps and overlying the isolating dielectric layer. An erase conductor layer is deposited overlying the erase dielectric layer and isolating dielectric layer. The erase conductor layer is etched down to confine the remaining erase conductor layer to the gaps and to thereby form erase gates laterally adjacent to the floating gates.

Also in accordance with the objects of this invention, a split-gate flash memory device is achieved. The device comprises a floating gate overlying a substrate. A control gate is laterally adjacent to the floating gate and overlies the substrate. An erase gate is laterally adjacent to the floating gate and overlies the control gate. The erase gate is between a sidewall spacer and the floating gate.

BRIEF DESCRIPTION OF THE DRAWINGS

In the accompanying drawings forming a material part of this description, there is shown:

FIGS. 2A and 16A, and 2B through 16B illustrate the preferred embodiment of the present invention. FIGS. 2A and 16A show top layout views. FIGS. 2B through 16B show cross sectional views.

DESCRIPTION OF THE PREFERRED EMBODIMENTS

The preferred embodiments of the present invention disclose a unique flash memory cell having an erase gate. A novel method of forming this flash memory cell on an integrated circuit device is achieved. It should be clear to those experienced in the art that the present invention can be applied and extended without deviating from the scope of the present invention.

Figure 1:
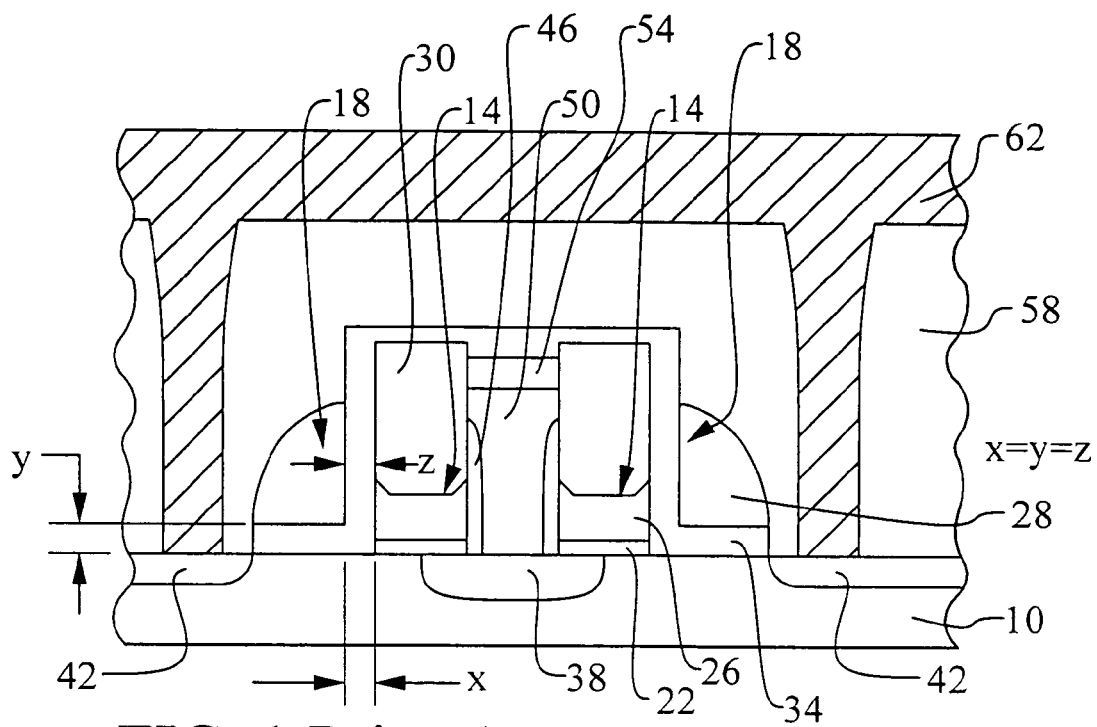
FIG. 1 illustrates a split-gate flash memory cell showing problems in the prior art.
Figure 2A:
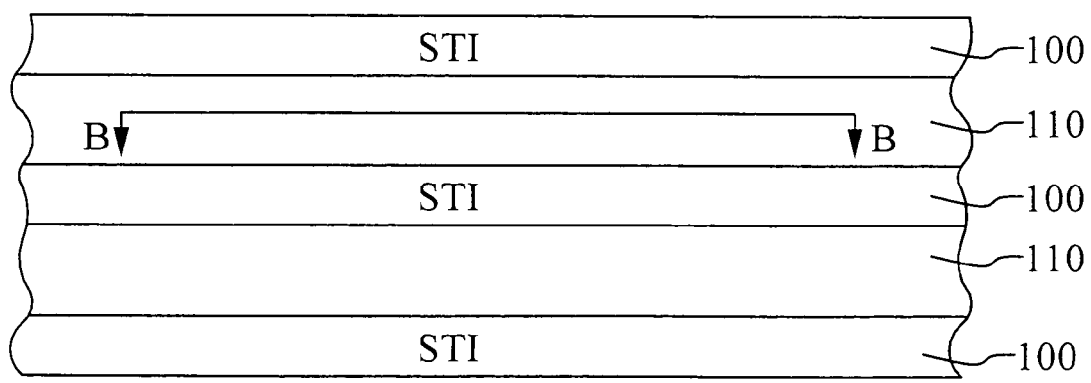

Referring now to FIGS. 2A, 16A and 2B through 16B, the preferred embodiment of the present invention is illustrated. Several important features of the present invention are shown and are discussed below. FIGS. 2A and 16A show the top view of the flash cell at the beginning and ending points of the disclosed method of formation. FIGS. 2B through 16B shown the novel device and the method of formation of the present invention in cross sectional representation.

Referring again to FIG. 2A, the top view of an integrated circuit device is shown. In this view, shallow trench isolation (STI) regions 100 have been defined in the substrate 100. These STI regions 100 serve to isolate adjacent active device areas 100. The STI regions 100 are formed using methods well-known in the art. A cross section B—B is taken in the active area 100. This cross section will show a flash cell formed by the method of the present invention.

Figure 2B:
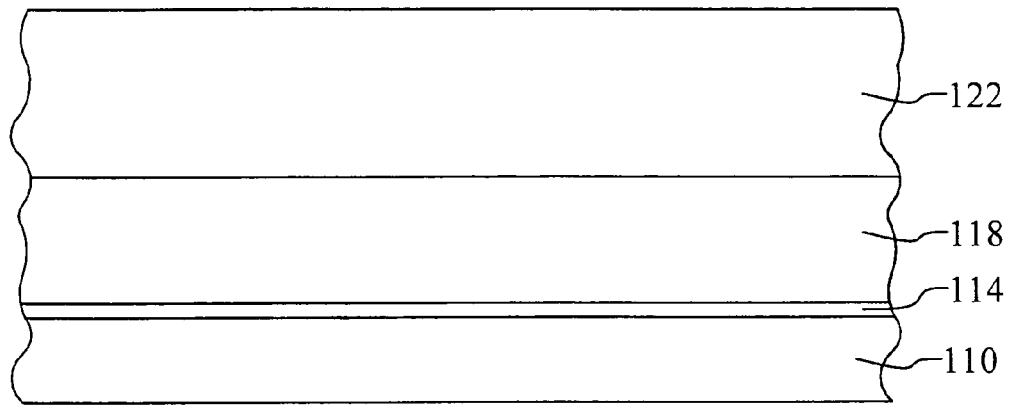

Referring now to FIG. 2B, the device is shown in cross section. The substrate 110 comprises a semiconductor material, such as silicon. The substrate 110 may comprise other semiconductor materials, such as Si—Ge, or may further comprise a composite structure such as silicon-on-insulator (SOI) as is well known in the art.

As a first feature, a method for forming floating gates on the surface of the substrate 110 is disclosed. Many methods for forming such floating gates are well known in the art. In the preferred method of the present invention, a floating gate dielectric layer 114 is first formed on the surface of the substrate 110. Most preferably, the floating gate dielectric layer 114 comprises silicon oxide that is grown on a silicon substrate 110 by thermal oxidation. However, the floating gate dielectric layer 114 could be formed using a deposition technique or could comprise a different type of dielectric, such metal oxide or nitride. This floating gate dielectric layer 114 should be a relatively thin layer to provide efficient electron transfer during programming. For example, the floating gate dielectric layer 114 may comprise silicon oxide grown to a thickness of between about 60 Angstroms and about 100 Angstroms.

A floating gate conductor layer 118 is deposited overlying the floating gate dielectric layer 114. The floating gate conductor layer 118 may comprise any conductive material but most preferably comprises polysilicon. For example, the floating-gate conductor layer 118 may comprises polysilicon that is deposited overlying the floating gate dielectric layer 114 to a thickness of between about 1000 Angstroms and about 2000 Angstroms. The floating gate conductor 118 and dielectric 114 layers may then be patterned to create openings for the formation of self-aligned, STI regions, as shown in FIG. 2A and as well known in the art.

Following definition of the STI regions 100, a masking layer 122 is deposited overlying the floating gate conductor layer 118 as shown in FIG. 2B. This masking layer 122 is used to form a hard mask for subsequent etching and implanting steps. This masking layer 122 preferably comprises a material that can be selectively etched with respect to the floating gate dielectric 114 and conductor 118 layers. Preferably, the masking layer 122 comprises silicon nitride that is deposited to a thickness of between about 2000 Angstroms and about 3000 Angstroms.

Figure 3B:
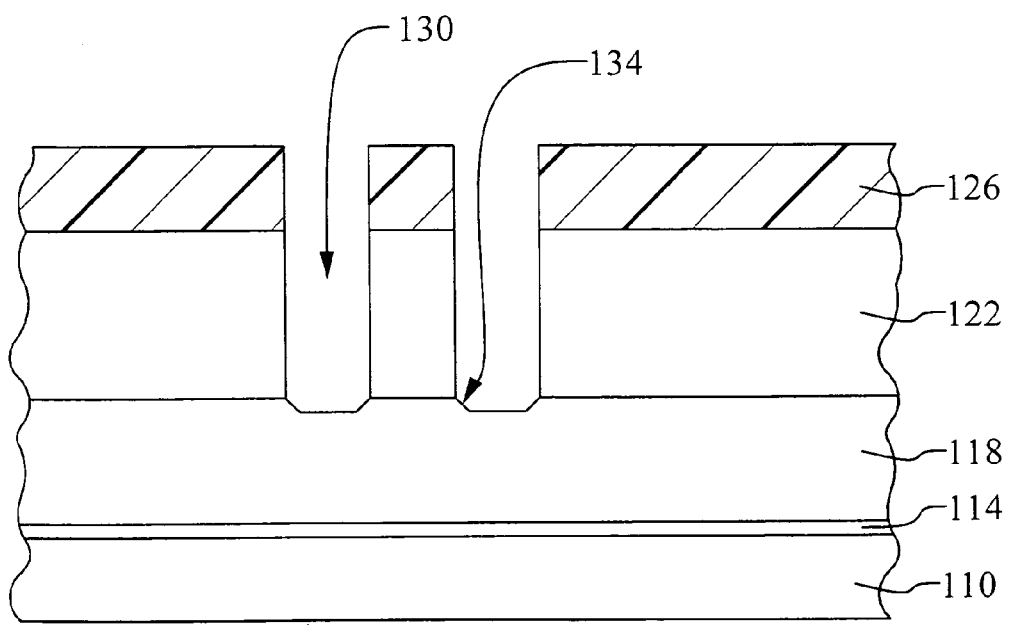

Referring now to FIG. 3B, the masking layer 122 is patterned to expose the floating gate conductor layer 118 where floating gates are planned. The masking layer 122 may be patterned using any known technique. For example, a photoresist layer 126 may be deposited overlying the masking layer 122. This photoresist layer 126 is then exposed to actinic light through a photo reticle, not shown, and developed. After development, the remaining photoresist layer 126 is an image or a negative image of the photo reticle pattern depending on the type of resist used. The photoresist layer 126 can then be used to mask an etch of the masking layer 122. The masking layer 122 may be etched using any of the known techniques, such as wet chemistry, dry chemistry, or plasma chemistry. As an additional feature of the present invention, the floating gate conductor layer 118 can be partially etched using a high pressure plasma that creates sloped tips on the floating gate conductor layer 118 at the boundaries of the etching hole. The creation of these sloped tips enhances the final floating gates by increasing the erasing efficiency. However, this is not a critical feature of the present invention.

Figure 4B:
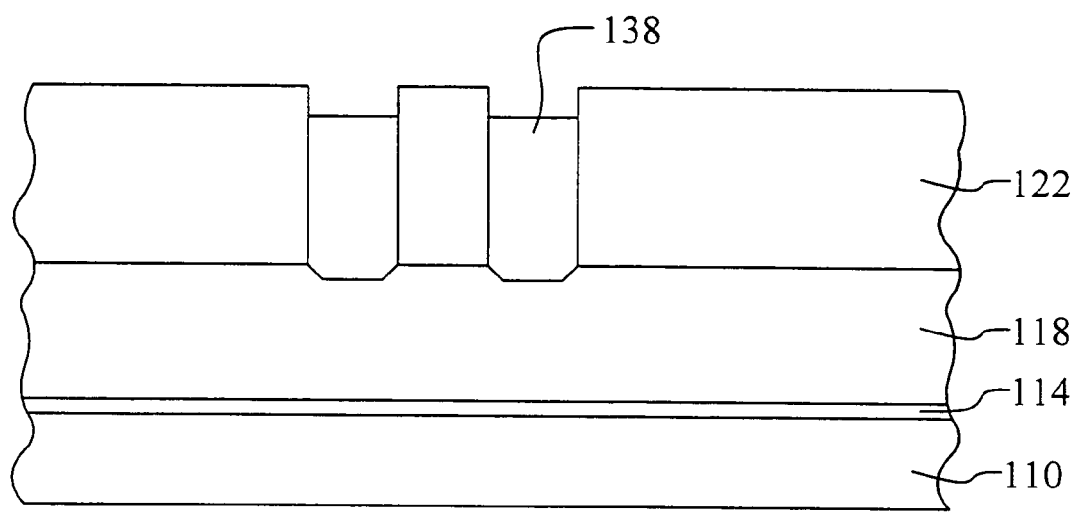

Referring now to FIG. 4B, the photoresist layer 126, if used, is removed. A structural dielectric layer 138 is then deposited overlying the masking layer 122 and filling the openings created by the masking layer 122 patterning step shown in FIG. 3B. This structural dielectric layer 138 will serve to define the height of the final flash structure. Preferably, this structural dielectric layer 138 comprises a material that can be selectively etched or planarized with respect to the masking layer 122. It is most preferred, therefore, that the structural dielectric layer 138 comprise silicon oxide that is deposited to a thickness of between about 2000 Angstroms and about 4000 Angstroms to insure complete filling of the openings. Following deposition, the structural dielectric layer 138 is planarized down to the top surface of the masking layer 122. This planarization preferably comprises a chemical mechanical polishing process as is known in the art, however, any planarizing technique may be used.

Figure 5B:
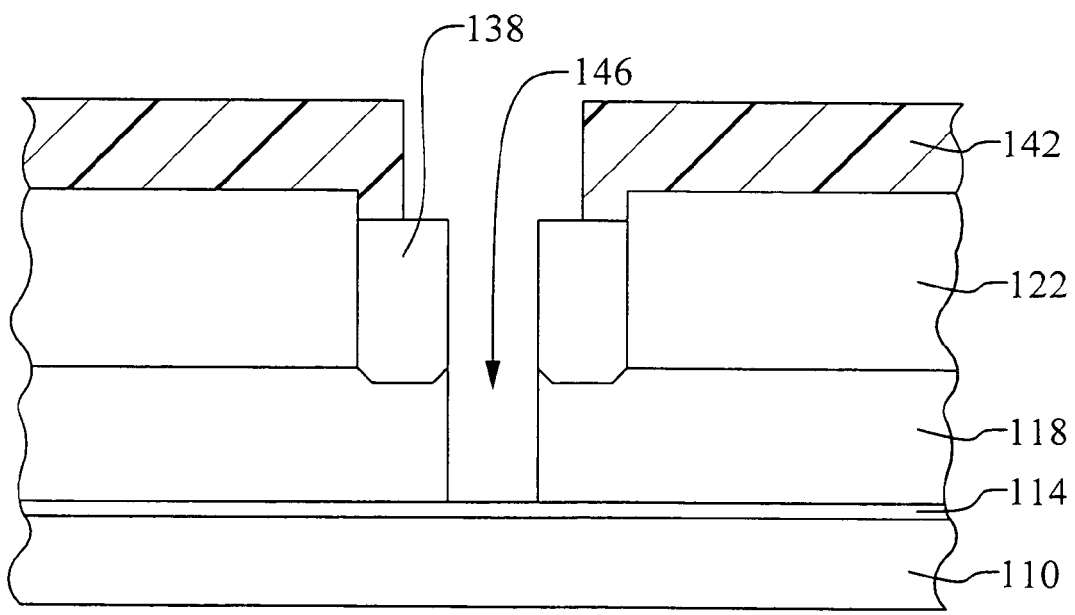

Referring now to FIG. 5B, common source openings 146 are patterned in the masking layer 122 and the floating gate conductor layer 118. As in the prior art example, the preferred embodiment, flash cell of the present invention uses a common source configuration. The patterning step may use a patterned photoresist layer 142 to protect the masking layer 122 in areas not etched. This photoresist layer 142 may be patterned as described above. Note that the selectivity of the etching process allows the exposed masking layer 122, between the structural dielectric layer 138, to be removed in a self-aligned fashion. That is, only the masking layer 122 and the underlying floating gate conductor 118 are removed during the etch even though the masking photoresist 142 is defined using a non-critical alignment to the floating gate mask.

Figure 6B:
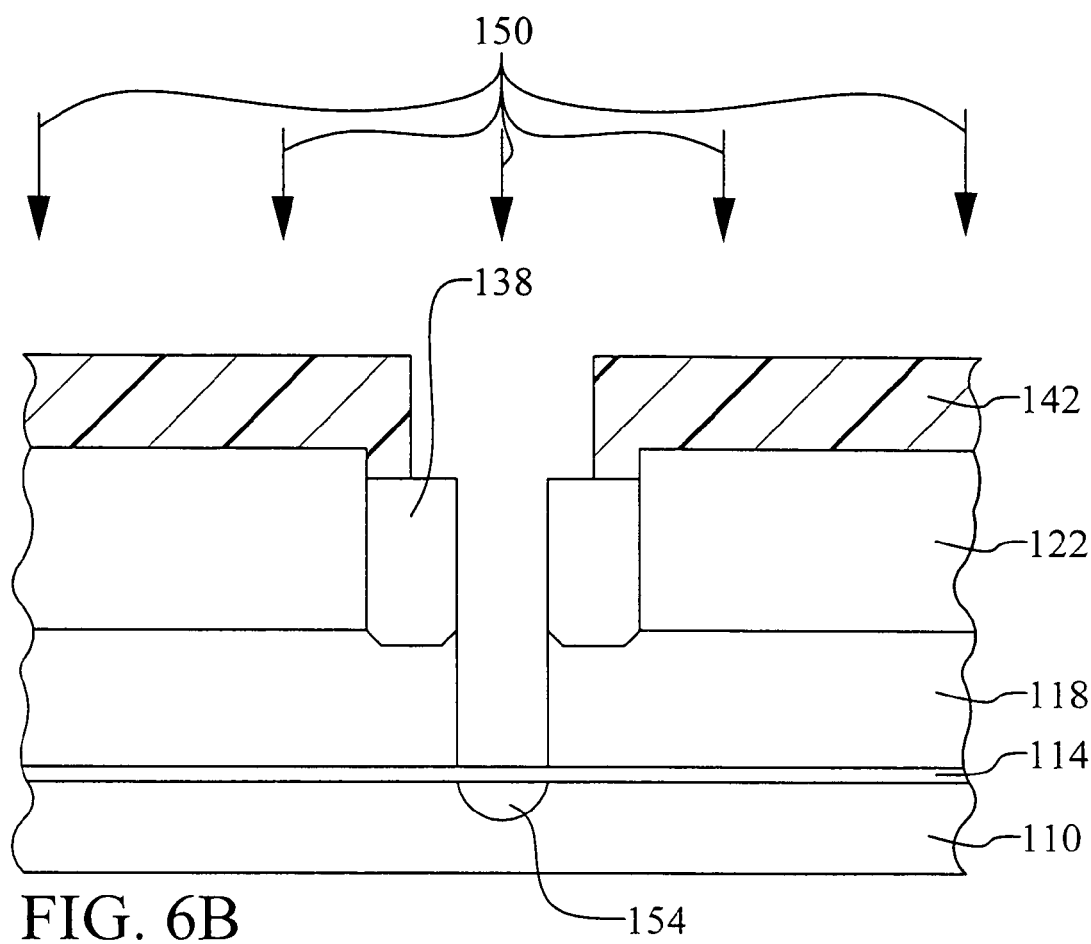

Referring now to FIG. 6B, ions are implanted 150 into the substrate 110 through the common source opening to form the common source regions 154. Preferably, the flash devices comprise NMOS-type transistors wherein the source and drain regions are N-type and the substrate is P-type. However, the teachings of the present invention will work for a PMOS-type device using P-type source/drain regions and an N-type substrate or well. Preferably, the ion implantation 150 comprises phosphorous ions implanted using a dose of between about $1\times10^{13}$ atoms/cm$^2$ and about $1\times10^{15}$ atoms/cm$^2$ and an energy of between about 10 KeV and about 30 KeV.

Figure 7B:
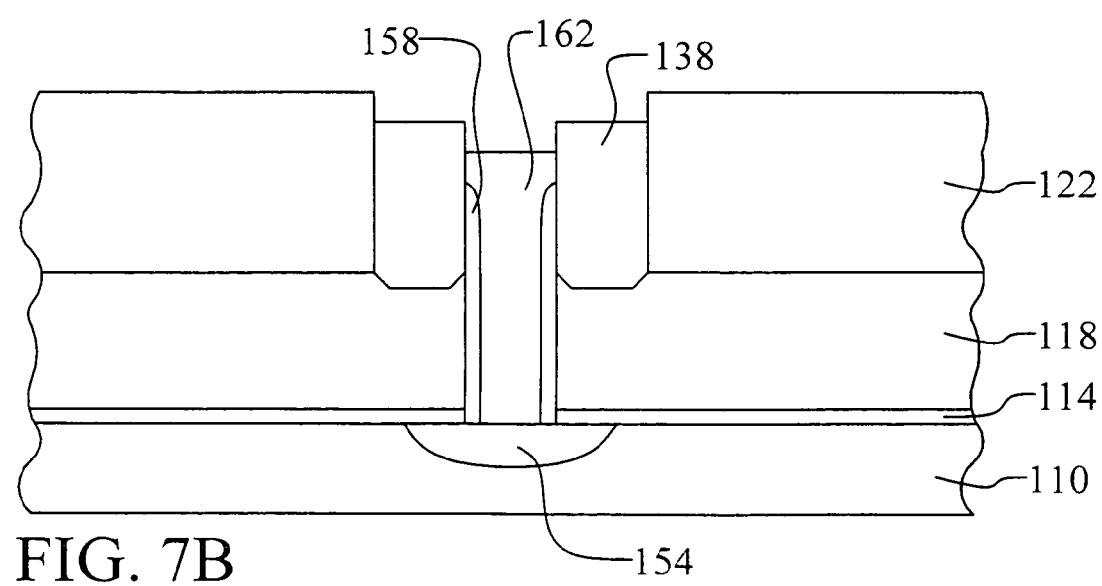

Referring now to FIG. 7B, a lining dielectric layer 158 is formed on the sidewalls of the common source opening. This lining dielectric layer 158 will serve as a dielectric barrier between the floating gate conductor layer 118 and the subsequently formed, common source plugs 162. Preferably, the lining dielectric layer 158 comprises silicon oxide that is first deposited and then etched back to form sidewall spacers as shown. During the deposition of the lining dielectric layer 158, the implanted source regions 154 are out-diffused due to the thermal process to complete the formation of the source regions as shown. Note also that the floating gate dielectric layer 114 is removed from the source region 154 during the etch back of the lining dielectric layer 158.

A source plug layer 162 is then deposited overlying the masking layer 122, the structural dielectric layer 138, the lining dielectric layer 158, the source regions 154, and filling the source openings. The source plug layer 162 preferably comprises a conductive layer such as polysilicon. For example, polysilicon may be deposited to a thickness of between about 2000 Angstroms and about 4000 Angstroms. The deposited source plug layer 162 is then planarized with respect to the structural dielectric layer 138. This planarization may comprise any known technique, such as CMP. At this point, the source plugs 162 have been formed for the common source connections of the flash cells. The use of source plugs is preferred but is not a critical part of the present invention.

Figure 8B:
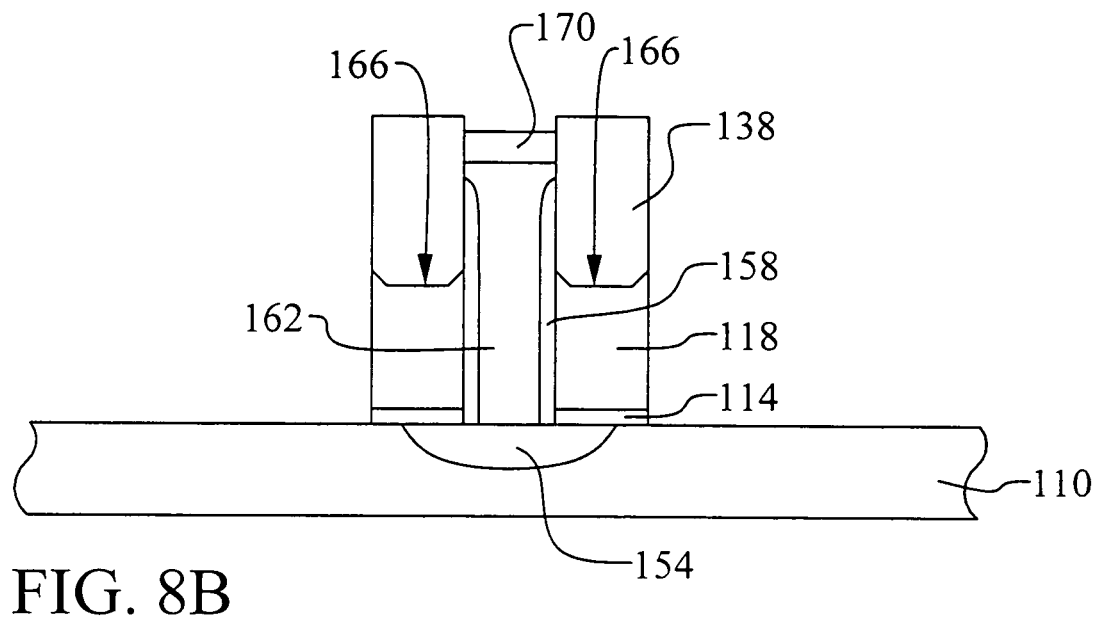

Referring now to FIG. 8B, a plug dielectric layer 170 is first formed overlying the source plug layer 162. This plug dielectric layer 170 is used to protect the plug layer from subsequent etching steps and to isolate the plug from subsequently formed conductors in the method of formation. Preferably, the plug dielectric layer 170 comprises a silicon oxide layer that is formed by oxidation of a polysilicon plug layer 162. For example, the plug dielectric layer 170 may comprise silicon oxide grown to a thickness of between about 100 Angstroms and about 300 Angstroms.

Next, the masking layer 122 is etched away. The selection of the structural dielectric layer 138 such that a selective etch may be performed allows the masking layer 122 to be etched away without using a mask. Further, the floating gate conductor layer 118 can then be etched using the structural dielectric layer 138 as a hard mask. This completes the formation of the floating gates 166 for the flash cells.

Figure 9B:
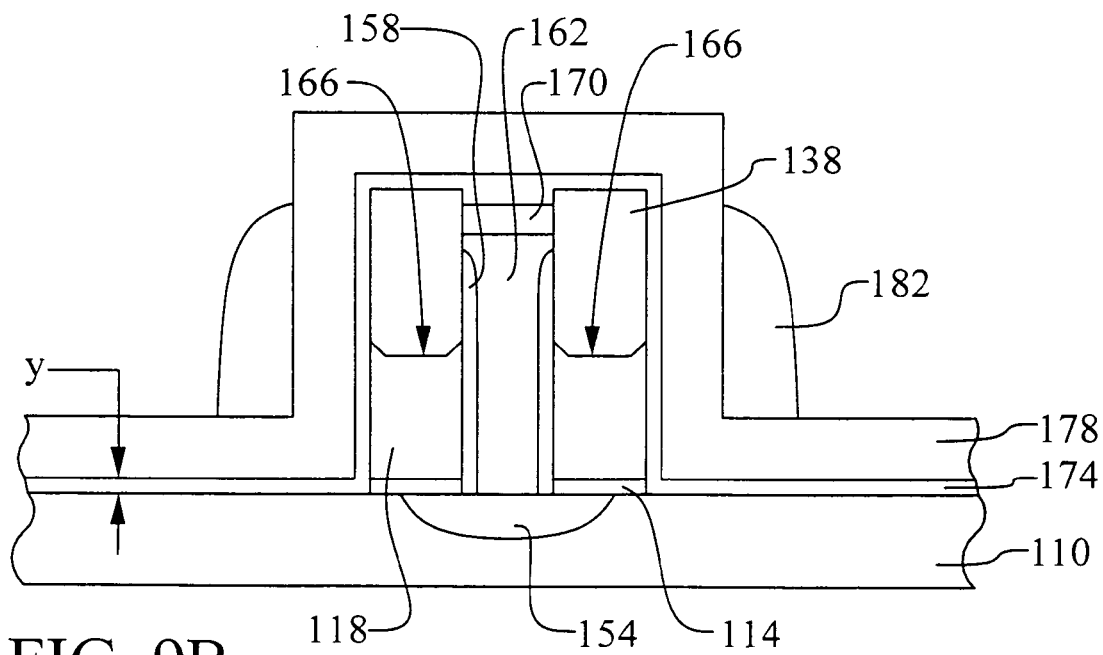

Referring now to FIG. 9B, as an important feature particularly unique to the present invention, a control dielectric layer 174 is formed overlying the floating gates 166 and the substrate 110. The control dielectric layer 174 will form the dielectric for the subsequently formed, control gate. As will be seen, the control dielectric layer 174 thickness Y will establish the dielectric layer thickness for the control gates. The control dielectric layer 174 may comprise any dielectric such as oxide, metal oxide, or nitride. Preferably, the control dielectric layer 174 comprises silicon oxide that is grown to a thickness of between about 20 Angstroms and about 50 Angstroms.

As another important feature, a control conductor layer 178 is formed overlying the control dielectric layer 174. The control conductor layer 178 will subsequently form the electrode for control gate. The control conductor layer 178 may comprise any conductive material. Preferably, the control conductor layer 178 comprises polysilicon. More preferably, the control conductor layer 178 comprises polysilicon deposited to a thickness of between about 600 Angstroms and about 1000 Angstroms. The thickness of the control conductor layer 178 establishes the subsequent width of the gap between the subsequently formed sidewall spacers and the floating gates 166.

As another important feature of the present invention, sidewall spacers 182 are formed on the control conductor layer 178. The sidewall spacers 182 may comprise any dielectric material such as oxide or nitride. Preferably, the sidewall spacers 182 comprise silicon oxide. More preferably, the sidewall spacers 182 are formed by first depositing silicon oxide, such as through TEOS CVD, overlying the control conductor layer 178 to a thickness of between about 1000 Angstrom and about 2000 Angstroms. The deposited silicon oxide is then etched back to form sidewall spacers 182 by a method well known in the art.

Figure 10B:
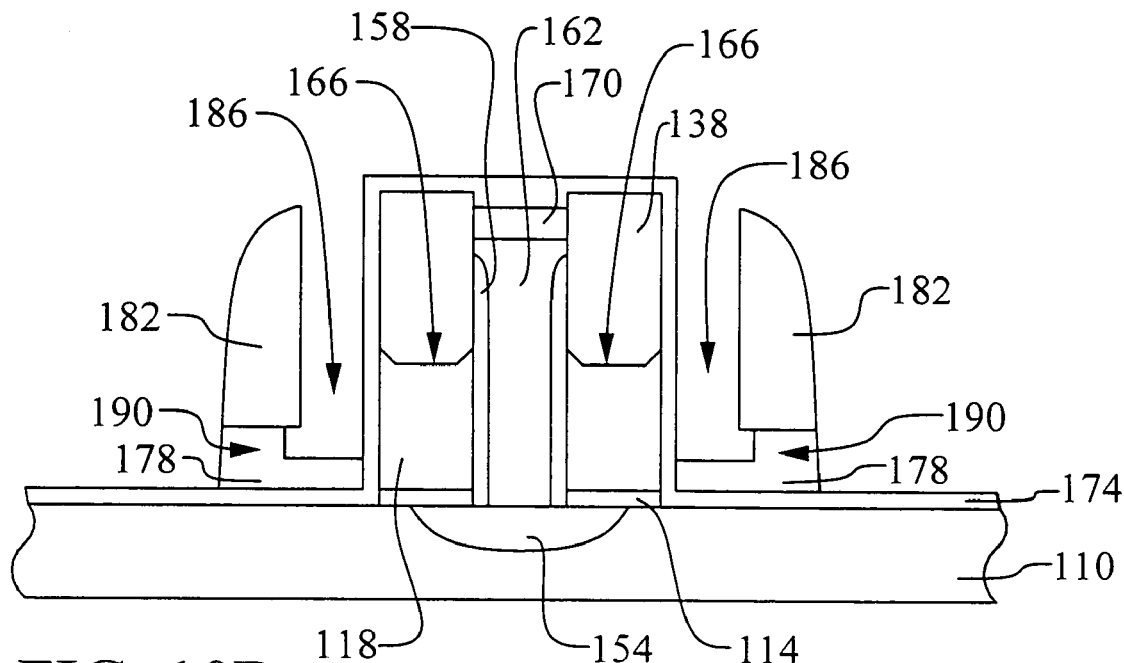

Referring now to FIG. 10B, a particularly important step in the method of the present invention is shown. The control conductor layer 178 is partially etched down to create gaps 186 between the sidewall spacers 182 and the floating gates 166. The remaining control conductor layer 178 forms control gates 190 laterally adjacent to the floating gates 166. The etching down of the control conductor layer 178 defines the word lines 190 for the flash cells. It is important to note that this etching down need not use a photo-masking step. Rather, the control conductor layer 178 may be etched down using the sidewall spacers 182 and the control dielectric layer 174 as hard masks. The etching down of the control conductor layer 178 is controlled, such as through a timer, so that the control conductor layer 178 is not completely etched through in the gap 186. However, the control conductor layer 178 is etched through in areas outside of the cell to insure that no word line 190 shorts exist. Note that the etching may cause some undercutting of the control conductor layer 178 below the sidewall spacers 182. The control gates 190 are thereby formed in a unique, self-aligned arrangement with respect to the floating gates 166.

Figure 11B:
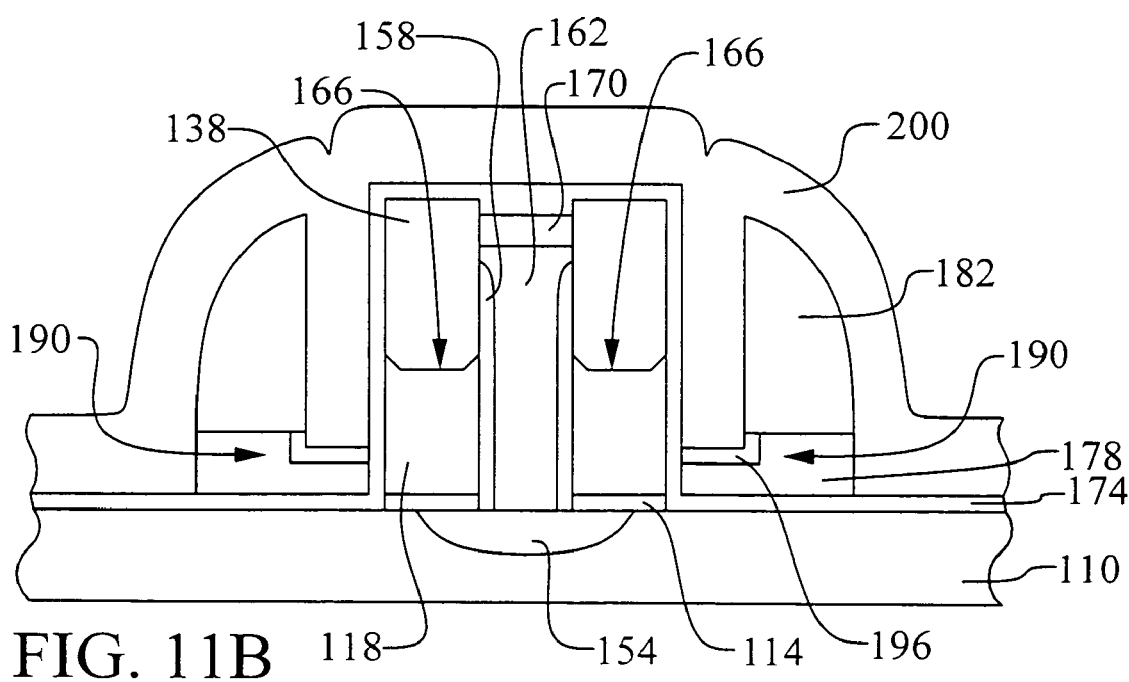
Figure 12B:
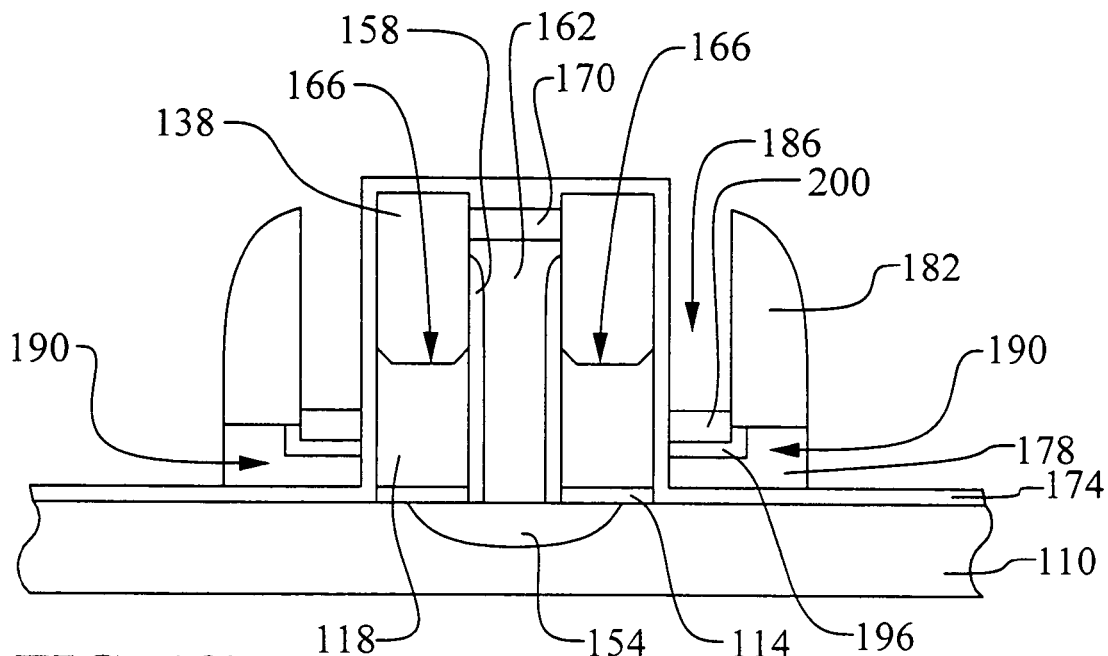

Referring now to FIGS. 11B and 12B, additional, important features of the present invention are shown. First, an isolating dielectric layer 196 and 200 is formed overlying the control gates 190. The isolating dielectric layer 196 and 200 is used to form a relatively thick insulator between the control gates 190 and the subsequently formed erase gates. The isolating dielectric layer 196 and 200 preferably comprises two materials. First, an oxide layer 196, such as silicon oxide, is formed overlying the control conductor layer 178 of the control gates 190. Some of this oxide layer will additionally form on exposed parts of the conductor dielectric layer 174 and on the sidewall spacers 182 though this is not shown since all of these materials are also preferably oxide. For example, the oxide layer 196 may comprise silicon oxide grown to a thickness of between about 50 Angstroms and about 100 Angstroms.

Next, a nitride layer 200, such as silicon nitride, is deposited overlying the sidewall spacers 182, the conductor dielectric layer 174, the oxide layer 196, and filling the gaps. This nitride layer 200 preferably comprises silicon nitride that is deposited to a thickness of between about 1000 Angstroms and about 2000 Angstroms. Referring again to FIG. 12B, the nitride layer 200 is then etched back to form a nitride plug 200. The combined thickness of the oxide layer 196 and the nitride plug 200 creates a relatively large insulator between the control gates 190 and the subsequently formed erase gates in the gaps 186. In this way, the erase gates will be electronically isolated from the control gates 190.

Figure 13B:
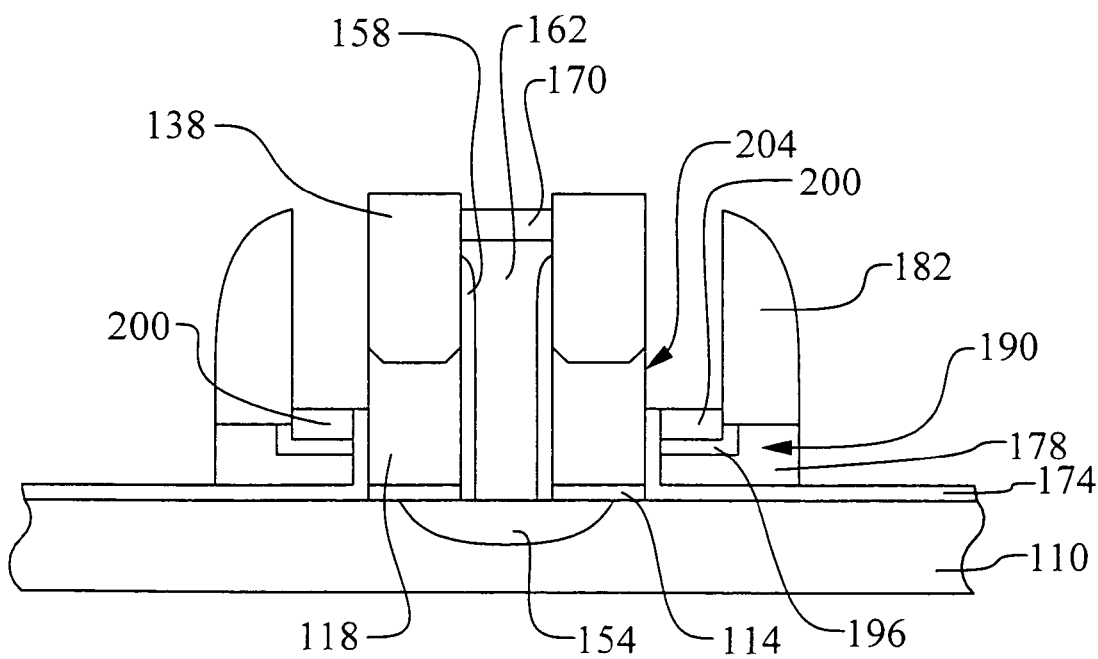

Referring now to FIG. 13B, an optional step in the method of the present invention is shown. The control dielectric layer 174 is etched away from the exposed floating gates 166. This step is useful for carefully controlling the thickness of the subsequently formed erase dielectric layer. Preferably, a wet dip in an oxide etchant will remove the control dielectric layer 174 from the floating gate conductor layer 118.

Figure 14B:
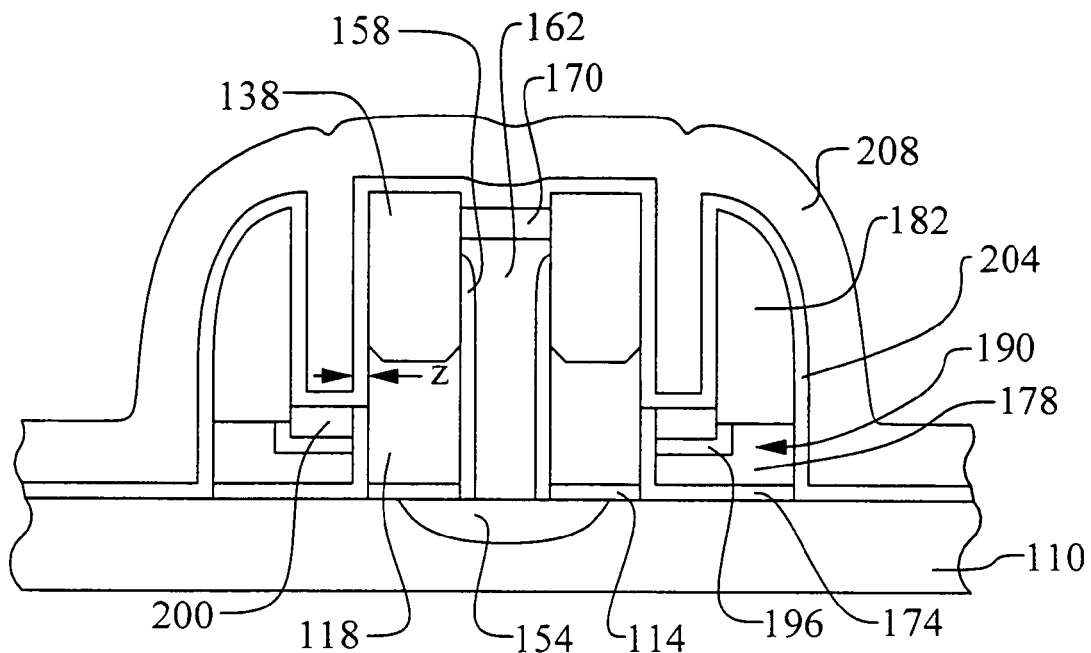

Referring now to FIG. 14B, other important steps in the method of the present invention are shown. An erase dielectric layer 204 is formed lining the gaps and overlying the isolating dielectric layer 200. The erase dielectric layer 204 will form the dielectric between the subsequently formed erase gates and the floating gate conductor layer 118. Preferably, the erase dielectric layer 204 comprises an oxide layer, such as silicon oxide or metal oxide. The erase dielectric layer 204 is formed to a thickness Z that meets the unique erase requirements for the device. Preferably, the erase dielectric layer 204 comprises silicon oxide that is grown to a thickness of between about 100 Angstroms and about 200 Angstroms.

An erase conductor layer 208 is then deposited overlying the erase dielectric layer 204 and the isolating dielectric layer 200. This erase conductor layer 208 will subsequently form the erase gate electrode for the device. The erase conductor layer 208 should comprise a conductive material. Preferably, polysilicon is used. Most preferably, polysilicon is deposited to a thickness of between about 1500 Angstroms and about 3000 Angstroms.

Figure 15B:
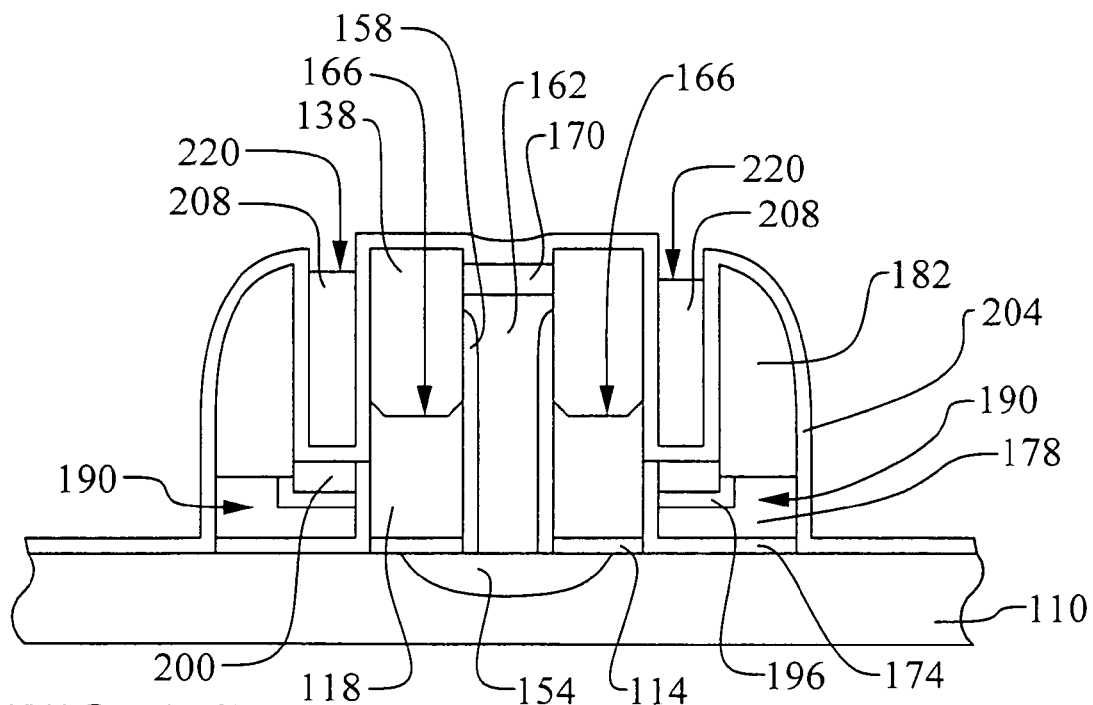
Figure 16A:
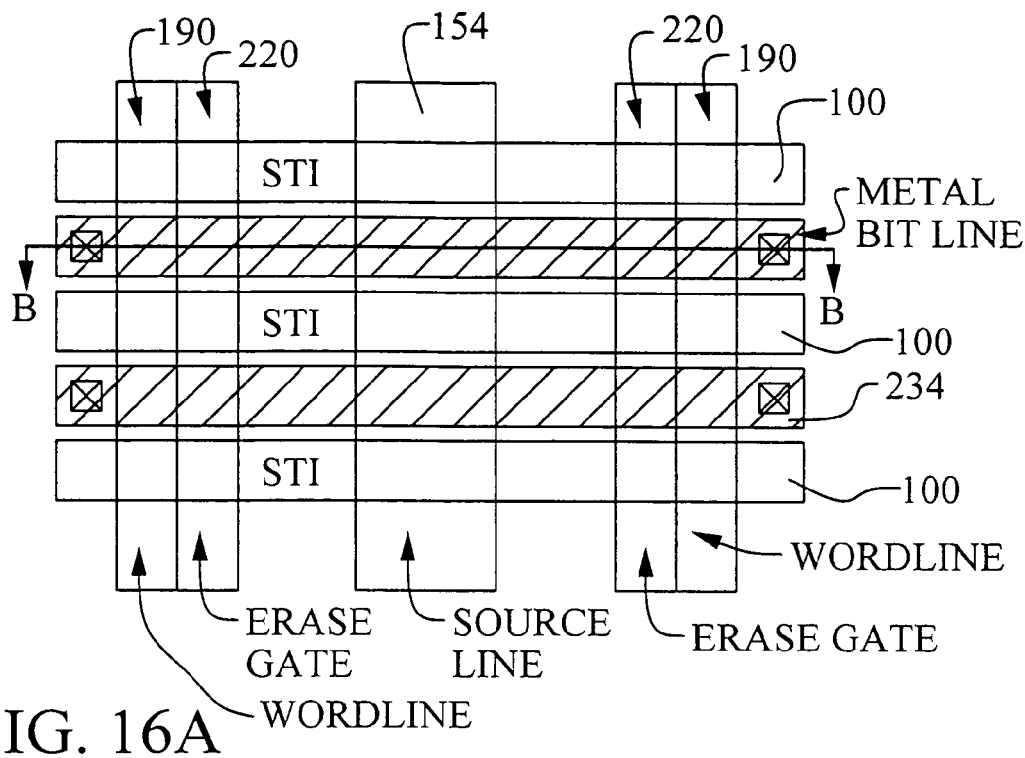

Referring now to FIG. 15B, another important feature of the present invention is shown. The erase conductor layer 208 is etched down to confine the remaining erase conductor layer 208 to the gaps and to thereby form erase gates 220 laterally adjacent to the floating gates 166. The etching down of the erase conductor layer 208 may be accomplished in either of two ways. First, and most preferred, the erase conductor layer 208 is simply etched down using a blanket etch that is selective to the erase conductor material 208. For example, an etch selective to polysilicon, but with a very slow oxide etch rate, could be used. In this way, the erase gates 220 will be formed self-aligned to the floating gates without the use of a photo-mask. Alternatively, a photolithographic step may be used to pattern the erase conductor layer 208. This option is particularly useful for define additional features in the layer 208 such as routing lines.

Figure 16B:
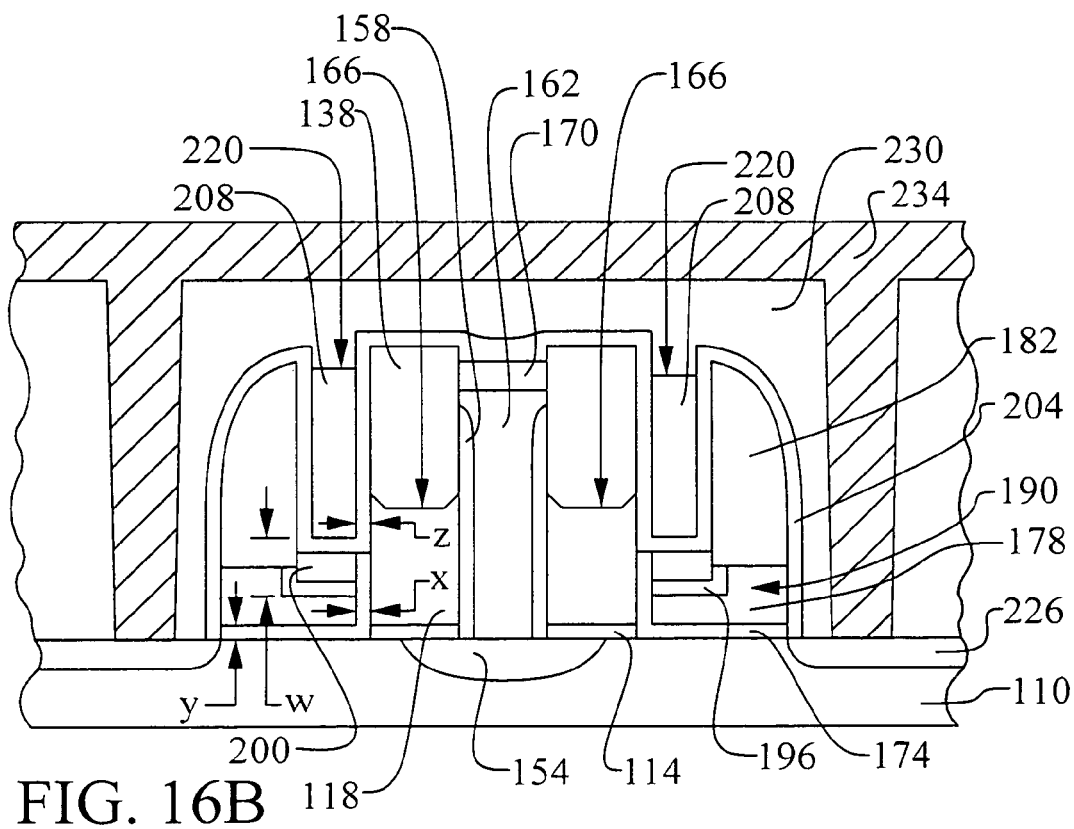

Referring now to FIG. 16A, the device is again shown in top view. At this point in the method, the source lines 154, the word lines 190, and the erase gates 220 have been formed. Subsequently, bit line drains will be implanted and metal bit lines 234 formed. Referring now to FIG. 16B, the cross sectional view is again illustrated. Bit line drains 226 are formed by implanting ions in the substrate 110 as is well known in the art. An interlayer dielectric (ILD) layer 230 is formed to isolate and protect the completed devices. Finally, contact openings are formed in the ILD layer 230, a metal layer 234 is deposited, and this metal layer is patterned to form the metal bit lines 234.

The completed device may now be described. The novel flash device comprises a floating gate 166 overlying a substrate 110. A control gate 190 is disposed laterally adjacent to the floating gate 166 and also overlies the substrate 110. An erase gate 220 is disposed laterally adjacent to the floating gate 166 and also overlies the control gate 190. The erase gate 220 is further disposed between a sidewall spacer 182 and the floating gate 166.

The unique structure of the present invention achieves several advantages. A separate erasing gate 220 is available. The separate erasing gate 220 has an interface dielectric 204 of thickness Z that can be made relatively thin to improve the tunneling efficiency during erasing. Meanwhile, the concern about gate oxide breakdown on the control gate 190 during erasing is eliminated since the high voltage is only forced onto the erasing gate. For example, during an erasing operation, the erasing gate 220 is forced to about 9 Volts while the control gate (word line) 190, the common source 154, and the bit line drain 226 are forced to 0 Volts.

By removing the control gate 190 from the erasing mode, the dielectric layer 174 between the control gate 190 and the floating gate 166 can be made to thickness X which can be substantially thinner. This improves the programming efficiency. For example, during a programming operation, the common source 154 is forced to about 10 Volts, the bit line drain to about 0.5 Volts, the word line gate to about 2.5 Volts, and the erase gate to about 0 Volts.

By removing the control gate 190 from the erasing mode, the dielectric layer 174 between the control gate and the substrate 110 can also be made thinner, to thickness Y, which can be substantially thinner. This improves the reading efficiency by increasing the current gain of the flash device. For example, during a reading operation, the word line 190 is driven to about 2.5 Volts, the bit line drain 226 is driven to about 1.5 Volts, and the common source 154 and the erase gate 220 are driven to 0 Volts.

The unique method of formation of the present invention allows the device to be fabricated in a thoroughly self-aligned fashion. That is, all the key interfaces in the device are self-aligned. The floating gate is self-aligned to the control gate. The floating gate is self-aligned to the diffusion. The control gate is self-aligned to the diffusion. The erase gate is self-aligned to the floating gate. The erase gate is self-aligned to the control gate.

The advantages of the present invention may now be summarized. An effective and very manufacturable flash memory device is provided. A method is provided to form a flash memory device with improved programming and erasing efficiency. The flash memory device has optimized efficiency and high reliability. The key elements of the flash structure are self-aligned. The flash memory cell has a dedicated erase gate. The flash memory cell incorporates an erase gate without increasing the cell size.

As shown in the preferred embodiments, the novel method and device of the present invention provides an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A split-gate flash memory device comprising:
    a floating gate overlying a substrate;
    a control gate overlying said substrate, comprising at least one sidewall laterally adjacent to said floating gate, and a top surface; and
    an erase gate laterally adjacent to said floating gate and overlying said top surface of said control gate wherein said erase gate is between a sidewall spacer and said floating gate.

2. The device according to claim 1 wherein said control gate comprises a polysilicon layer.

3. The device according to claim 1 wherein said erase gate comprises a polysilicon layer.

4. The device according to claim 1 wherein said control gate is formed by partially etching down a conductor layer to confine said conductor to a gap between said sidewall spacer and said floating gate.

5. The device according to claim 1 wherein said erase gate and said control gate are separated by an isolating layer comprises:
    an oxide layer overlying said control gate; and
    a nitride layer overlying said oxide layer.

6. The device according to claim 1 further comprising a source region adjacent to said floating gate.

7. The device according to claim 6 further comprising a polysilicon plug contacting said source region.

8. The device according to claim 1 further comprising a structural dielectric layer overlying the floating gate.

9. The device according to claim 1 wherein the erase gate and the floating gate are separated by an erase dielectric layer.

10. The device according to claim 1 wherein the control gate and the floating gate are separated by a control dielectric layer.

11. The device according to claim 1 further comprising a drain region in the substrate outside of the control gate.

12. The device according to claim 11 further comprising a metal bit line contacting the drain region.

13. A split-gate flash memory device comprising:
    a floating gate overlying a substrate;
    a structural dielectric layer overlying the floating gate;
    a control gate laterally adjacent to the floating gate and overlying the substrate;
    a sidewall spacer overlying the control gate;
    an erase gate surrounded by an erase dielectric layer, overlying the control gate and between the sidewall spacer and the structural dielectric layer;
    a source region in the substrate adjacent to the floating gate; and
    a drain region in the substrate outside of the control gate.

14. The device according to claim 13 wherein the control gate and the floating gate are separated by a control dielectric layer.

15. The device according to claim 13 further comprising a nitride layer between the erase gate and the control gate.

16. The device according to claim 13 further comprising a source plug contacting the source region.

17. The device according to claim 13 further comprising a metal bit line contacting the drain region.

18. A split-gate flash memory device comprising:
    a substrate having a source region and a drain region;
    a source plug disposed on the source region;
    a floating gate overlying the substrate adjacent to the source region and insulated from the substrate;
    a structural dielectric layer overlying the floating gate;
    a control gate laterally adjacent to the floating gate and overlying the substrate, wherein the control gate is insulated from the floating gate and the substrate by a control dielectric layer;
    a sidewall spacer overlying the control gate and separated from the structural dielectric layer by a gap;
    an erase gate disposed in the gap and surrounded by an erase dielectric layer; and
    a metal bit line contacting the drain region.

19. The device according to claim 18 wherein the erase gate and the control gate are separated by an isolating layer.

20. The device according to claim 19 wherein the isolating layer comprises a nitride layer.

21. The device according to claim 18 further comprising a plug dielectric layer overlying the source plug.

* * * * *